United States Patent
Jo et al.

(10) Patent No.: US 10,961,626 B2
(45) Date of Patent: Mar. 30, 2021

(54) PLASMA PROCESSING APPARATUS HAVING INJECTION PORTS AT BOTH SIDES OF THE GROUND ELECTRODE FOR BATCH PROCESSING OF SUBSTRATES

(71) Applicant: EUGENE TECHNOLOGY CO., LTD., Yongin-Si (KR)

(72) Inventors: Jeong Hee Jo, Yongin-Si (KR); Hong Won Lee, Seoul (KR); Sung Ho Kang, Hwaseong-Si (KR); Chang Dol Kim, Yongin-Si (KR); Gyu Ho Choi, Yongin-Si (KR)

(73) Assignee: EUGENE TECHNOLOGY CO., LTD.

( * ) Notice: Subject to any disclaimer, the term of this patent is extended or adjusted under 35 U.S.C. 154(b) by 231 days.

(21) Appl. No.: 16/025,970

(22) Filed: Jul. 2, 2018

(65) Prior Publication Data

US 2019/0085456 A1    Mar. 21, 2019

(30) Foreign Application Priority Data

Sep. 20, 2017  (KR) .................. 10-2017-0121352

(51) Int. Cl.
| | | |
|---|---|---|
| *C23C 16/507* | (2006.01) | |
| *C23C 16/452* | (2006.01) | |
| *C23C 16/455* | (2006.01) | |
| *C23C 16/505* | (2006.01) | |
| *H01J 37/32* | (2006.01) | |

(52) U.S. Cl.
CPC ...... *C23C 16/45578* (2013.01); *C23C 16/452* (2013.01); *C23C 16/505* (2013.01); *C23C 16/507* (2013.01); *H01J 37/3244* (2013.01)

(58) Field of Classification Search
CPC .............................. C23C 16/45578
See application file for complete search history.

(56) References Cited

U.S. PATENT DOCUMENTS

| | | | | |
|---|---|---|---|---|
| 2003/0038112 A1* | 2/2003 | Liu | ................... | H01J 37/32935 216/60 |
| 2003/0164143 A1* | 9/2003 | Toyoda | ................. | H01L 21/205 118/723 E |

(Continued)

FOREIGN PATENT DOCUMENTS

| | | |
|---|---|---|
| CN | 103635992 A | 3/2014 |
| CN | 105887050 A | 8/2016 |

(Continued)

*Primary Examiner* — Karl Kurple
(74) *Attorney, Agent, or Firm* — Renaissance IP Law Group LLP

(57) ABSTRACT

A substrate processing apparatus in accordance with an exemplary embodiments include: a first tube configured to provide a processing space in which a plurality of substrates are processed; a substrate support part configured to load the plurality of substrates in a first direction in the processing space; a plurality of gas supply parts provided with supply ports for supplying a process gas required for a process in which the substrates are processed; an exhaust part configured to communicate with the first tube and discharge process residues inside the processing space to the outside; and a plasma reaction part provided outside the first tube, and configured to decompose, with plasma, the process gas supplied from the gas supply part and provide the decomposed process gas to the processing space.

12 Claims, 8 Drawing Sheets

(56) References Cited

U.S. PATENT DOCUMENTS

| | | | |
|---|---|---|---|
| 2008/0132083 A1* | 6/2008 | Matsuura | C23C 16/507 438/770 |
| 2009/0197425 A1* | 8/2009 | Ishimaru | C23C 16/509 438/761 |
| 2009/0203198 A1 | 8/2009 | Seo | |
| 2010/0224128 A1* | 9/2010 | Yamaguchi | H01J 37/32935 216/60 |
| 2010/0278999 A1* | 11/2010 | Onodera | C23C 16/52 427/8 |
| 2015/0187559 A1* | 7/2015 | Sano | H01L 21/0228 438/763 |
| 2016/0326651 A1* | 11/2016 | Sato | H01L 21/0228 438/763 |
| 2018/0182601 A1* | 6/2018 | Takeda | H01J 37/32935 |
| 2019/0108985 A1* | 4/2019 | Kang | C23C 16/50 |

FOREIGN PATENT DOCUMENTS

| | | | | |
|---|---|---|---|---|
| JP | H05234950 A | 9/1993 | | |
| JP | H05251391 A | 9/1993 | | |
| JP | H07176399 A | 7/1995 | | |
| JP | H11243062 A | 9/1999 | | |
| JP | 2001335944 A | 12/2001 | | |
| JP | 2002280378 A | 9/2002 | | |
| JP | 2004124234 A | 4/2004 | | |
| JP | 2004174320 A | 6/2004 | | |
| JP | 2005032700 A | 2/2005 | | |
| JP | 2006190876 A | 7/2006 | | |
| JP | 2007266297 A | 10/2007 | | |
| JP | 2008172168 A | 7/2008 | | |
| JP | 2009088565 A | 4/2009 | | |
| JP | 2010157511 A | 7/2010 | | |
| JP | 2012114340 A | 6/2012 | | |
| JP | 2013157491 A | 8/2013 | | |
| JP | 2018107304 A | * | 7/2018 | H01J 37/32935 |
| KR | 19990029069 | | 4/1999 | |
| KR | 20120007864 A | | 1/2012 | |
| KR | 20120030719 A | | 3/2012 | |
| KR | 20120105339 A | | 9/2012 | |
| KR | 101396602 B1 | | 5/2014 | |
| KR | 20150004274 A | | 1/2015 | |
| TW | 201705197 A | | 2/2017 | |
| WO | 2014030224 A1 | | 2/2014 | |

* cited by examiner

PLASMA PROCESSING APPARATUS HAVING INJECTION PORTS AT BOTH SIDES OF THE GROUND ELECTRODE FOR BATCH PROCESSING OF SUBSTRATES

CROSS-REFERENCE TO RELATED APPLICATION

This application claims priority to Korean Patent Application No. 10-2017-0121352 filed on Sep. 20, 2017 and all the benefits accruing therefrom under 35 U.S.C. § 119, the contents of which are incorporated by reference in their entirety.

BACKGROUND

The present disclosure relates to a batch type plasma substrate processing apparatus, and more particularly, to a batch type plasma substrate processing apparatus in which a process gas decomposed outside is supplied into an inner processing space.

In general, a substrate processing apparatuses is an apparatus in which a substrate to be processed is located in a processing space, and then, reaction particles included in the process gas injected into the processing space are deposited on the substrate by means of a chemical vapor deposition method, an atomic layer deposition method, or the like. The substrate processing apparatus includes a single wafer type capable of performing a substrate processing process on one substrate and a batch type capable of simultaneously performing substrate processing processes on a plurality of substrates.

In case of a general substrate processing apparatus, a heating means is provided so that reaction particles of a process gas injected into a processing space are deposited on a substrate, but a problem occurs due to high temperatures and a long-time process at the high temperatures. In particular, in case of the batch type, since a plurality of substrates are accommodated inside the processing space, the entire substrates cannot be evenly heated, and thus problems occur in that a temperature gradient is generated and a long reaction time is required. Accordingly, in order to mitigate the temperature gradient and promote ionization or a chemical reaction of the processing gas to thereby lower the temperature and the time of the reaction in the processing space, plasma is formed in the space inside the processing space.

Meanwhile, in general, in the batch-type substrate processing apparatus, the temperatures of a wall surface of the processing space as well as the substrate are raised by a hot wall-type heating means surrounding the processing space, and thus an unwanted thin film is formed while the processing gases are deposited on the wall surfaces inside the processing space. However, when a process environment such as the plasma is formed in the processing space, there is a problem in that the thin film deposited on the inner wall acts as a contaminating substance during the substrate processing process while separated as particles by means of a magnetic field or an electric filed formed in a plasma generation space. Therefore, problems occur in that not only the quality of the thin film on the substrate, but also the efficiency of the processing process on the substrate is degraded.

RELATED ART DOCUMENTS

[Patent document 1] Korean Patent Publication No. 10-1396602

SUMMARY

The present disclosure provides a batch-type plasma substrate processing apparatus in which a process gas plasma-decomposed outside is supplied into a processing space.

In accordance with an exemplary embodiment, a substrate processing apparatus includes: a first tube configured to provide a processing space in which a plurality of substrates are processed; a substrate support part configured to load the plurality of substrates in a first direction in the processing space; a plurality of gas supply parts provided with supply ports for supplying a process gas required for a process in which the substrates are processed; an exhaust part configured to communicate with the first tube and discharge process residues inside the processing space to the outside; and a plasma reaction part provided outside the first tube, and configured to plasma-decompose the process gas supplied from the gas supply part and provide the decomposed process gas to the processing space.

The substrate processing apparatus may further include a second tube configured to be spaced apart from the first tube and surround the outside of the first tube so that a separation space is formed between the second tube and the first tube, wherein the plasma reaction part is provided in the separation space.

The plasma reaction part may include: a plurality of power supply electrode parts extending in the first direction; and a ground electrode part provided between the plurality of power supply electrode parts and extending in the first direction.

The plasma reaction part may accommodate the plurality of electrode parts and the ground electrode part and further include a barrier rib configured to define an inner space in which the plasma is formed.

The substrate processing apparatus may further include a variable power supply part configured to control a size or ratio of a RF power applied to each of the plurality of power supply electrode parts to thereby supply the RF power.

The variable power supply part may include: a power supply part configured to supply the RF power to the plurality of power supply electrode parts; and a plurality of variable capacitors respectively provided between the power supply part and the plurality of power supply electrode parts.

The variable power supply parts may further include probing rods which are respectively provided in the spaces between the plurality of power supply electrode parts and the ground electrode part and configured to measure discharge characteristic values of the plasma, wherein the size and ratio of the RF power may be adjusted according to the discharge characteristic values measured from the probing rods.

The substrate processing apparatus may further include a ceramic tube configured to surround outer peripheral surfaces of the plurality of power supply electrode parts and the ground electrode part.

The plurality of power supply electrode parts and the ground electrode part may be disposed to be spaced apart from each other in a peripheral direction of the first tube, and the plurality of gas supply parts may extend in the first direction and respectively be provided outside the power supply electrode parts.

The supply ports of the gas supply parts may be formed to face a direction opposed to the power supply electrode parts.

The plurality of gas supply parts may extend in the first direction and be provided outside a line connecting the power supply electrode parts and the ground electrode part, and each of the supply ports of the gas supply parts may be provided to face the space between the power supply electrode parts and the ground electrode part.

The first tube may include a plurality of injection ports disposed in the first direction corresponding to the power supply electrode parts, and the injection ports and the supply ports may be provided to be misaligned with each other with respect to a radial direction from a central axis of the first tube to the supply ports.

The gas supply parts may include: a reaction gas supply part configured to supply a reaction gas to the plasma reaction part; and a source gas supply part configured to supply a source gas to the processing space, wherein the plasma reaction part may decompose the reaction gas with plasma.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
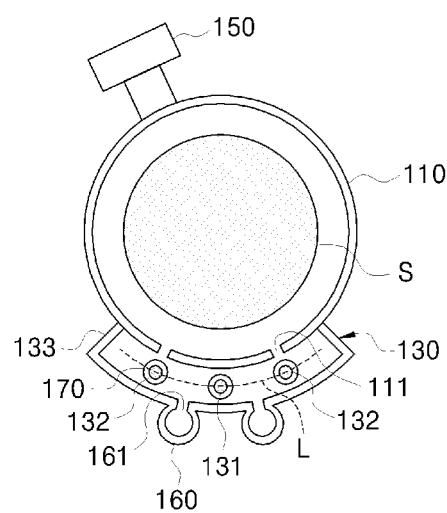
FIG. 1 is a plan view illustrating a substrate processing apparatus in accordance with an exemplary embodiment.

Hereinafter, specific embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. The drawings may be exaggerated to describe the present disclosure, and like reference numerals refer to like elements in the drawings.

Figure 2:
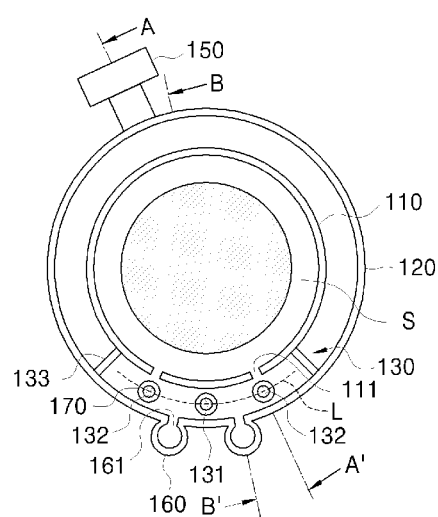
FIG. 2 is a plan view illustrating a substrate processing apparatus in accordance with another exemplary embodiment.
Figure 3A:
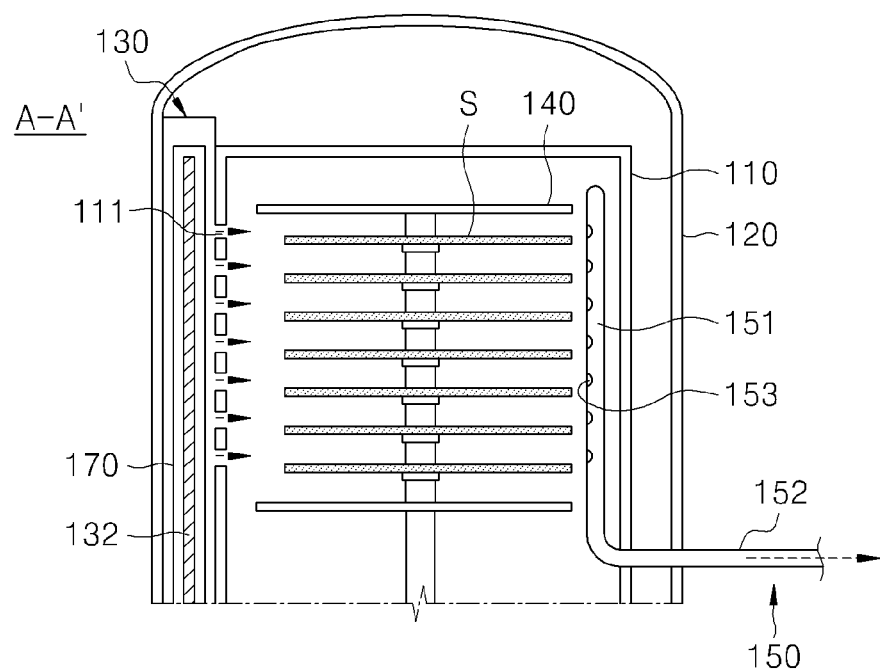
FIG. 3A is a cross-sectional view taken along line A-A' of the plan view in FIG. 2.
Figure 3B:
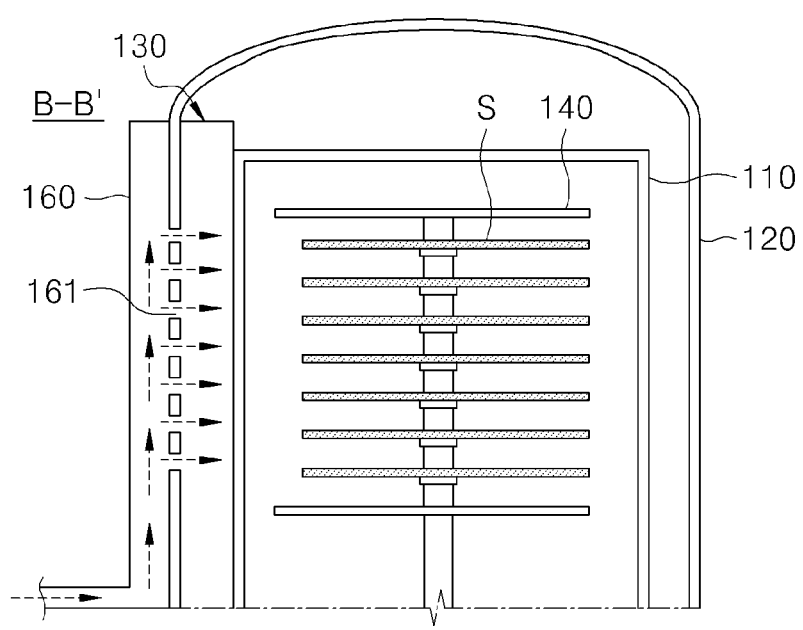
FIG. 3B is a cross-sectional view taken along line B-B' of the plan view in FIG. 2.

FIG. 1 is a plan view illustrating a substrate processing apparatus in accordance with an exemplary embodiment, FIG. 2 is a plan view illustrating a substrate processing apparatus in accordance with another exemplary embodiment, FIG. 3A is a cross-sectional view taken along line A-A' of the plan view in FIG. 2, and FIG. 3B is a cross-sectional view taken along line B-B' of the plan view in FIG. 2.

Referring to FIGS. 1 to 3B, a substrate processing apparatus in accordance with an exemplary embodiment may include: a first tube 110 which provides a processing space in which a plurality of substrates S are processed; a substrate support part 140 on which the plurality of substrates S are loaded in a first direction in the processing space; a plurality of supply parts 160 each provided with a supply port 161 for providing a process gas required in the process in which the substrates S are processed; an exhaust part 150 which communicates with the first tube 110 to discharge process residues in the processing space to the outside; and a plasma reaction part 130 which is provided outside the first tube 110, and decomposes, with plasma, the process gas received from the gas supply part 160 to thereby supply the decomposed process gas to the processing space.

First, according to a method of arranging substrates S for which a process is to be performed, substrate processing apparatuses are classified into a single wafer type method in which a substrate processing process can be performed on one substrate S and a batch type method in which substrate processing processes can be simultaneously performed on a plurality of substrates S. However, in the present disclosure, the batch type method in which a plurality of substrates S are loaded in the vertical direction (the first direction) will only be described.

The substrate processing apparatus in accordance with an exemplary embodiment may have a structure in which the first tube 110 and the second tube 120 accommodating the first tube 110 are formed to be spaced apart from each other so as to maintain a predetermined distance from each other, and the first tube 110 and the second tube 120 may be formed of a heat resistant material such as quartz or ceramic.

The first tube 110 may be formed in a cylindrical shape with the open lower portion and provide therein a processing space in which a plurality of substrates S are accommodated and processed. The processing space of the first tube 110 is a region in which an actual process is performed on the substrate support part 140 on which the plurality of substrates S are stacked.

The substrate support part 140 is a configuration for supporting the substrates S, may be formed such that the plurality of substrates S are loaded in the first direction, that is, in the vertical direction, and may have a plurality of unit processing spaces which are formed therein and in which the plurality of substrates S are respectively processed. That is, the substrate support part 140 may have a plurality of layers so that the substrates S are loaded in the first direction, and one substrate S may be loaded on one layer (or the unit processing space). Thus, the unit processing space for a substrate S is individually formed on each layer of the substrate support part 140 and thus, an occurrence of interference between the unit processing spaces may be prevented.

When all the plurality of substrates S are loaded, the substrate support part 140 may be moved through the lower portion (or an entrance) of the first tube 110, and the substrate support part 140 may have various shapes and structures, which are not particularly limited, if only having a shape on which the plurality of substrates S can be mounted and supported.

In addition, a plurality of injection ports 111 which inject a process gas decomposed by the plasma reaction part 130 to be described later may be formed in the above-mentioned first tube 110. The plurality of injection ports 111 may be formed at different heights from each other corresponding to respective unit processing spaces of the substrate support part 140 so as to respectively supply the plurality of substrates S with the process gas decomposed by the plasma reaction part 130.

The exhaust part 150 may be disposed inside the processing space and function to discharge process residues in the processing space to the outside. The exhaust part 150 may be configured from: an exhaust member 151 extending in the first direction; an exhaust line 152 connected to the exhaust member 151; and an exhaust pump (not shown). Since the exhaust member 151 is provided with a plurality of exhaust ports 153 which are opposed to the injection ports 111 of the first tube 110 and formed at different heights from each other in the first direction corresponding to respective unit processing spaces, the decomposed gas supplied to the plurality of substrates S through the injection ports 111 of the above-mentioned first tube 110 may pass through the substrates S and be suctioned to the exhaust ports 153.

As such, the injection ports 111 of the first tube 110 and the exhaust ports 153 of the exhaust part 150 are located on the same line, corresponding to each other, in a second direction (for example, a direction parallel to the surfaces of the substrates) crossing the first direction in which the substrates S are loaded. Therefore, the decomposed gas injected from the injection ports 111 may form a laminar flow while being introduced into the exhaust ports 153. That is, since the decomposed gas may be introduced into the exhaust ports 153 while being moved along the substrates S after contacting the surfaces of the substrates S, the decomposed gas may flow in the direction parallel to the surfaces of the substrates S and thus be evenly supplied to the upper surfaces of the substrates S.

The gas supply part 160 may supply the process gas required in the substrate processing process. The gas supply part 160 may be configured to include a gas supply tube 160 provided with a supply port 161 for supplying the process gas; and a gas supply source (not shown) which is connected to the gas supply tube 160 and supplies, from the outside, the process gas required for the substrate processing process.

In case of a general substrate processing apparatus, a heating means are provided so that reaction particles of a process gas injected into a processing space are deposited on a substrate, but a problem occurs due to high temperatures and long-time process at the high temperatures. In particular, in case of the batch type, since a plurality of substrates are accommodated inside the processing space, the entire substrates cannot be evenly heated, and thus problems occur in that a temperature gradient is generated and a long reaction time is required. Accordingly, in order to mitigate the temperature gradient and promote ionization or a chemical reaction of the processing gas to thereby decrease the temperature and the time of the reaction in the processing space, plasma is formed in the space inside the processing space. However, a wall surface of the processing space as well as the substrate are heated by a hot wall-type heating means surrounding the processing space, and thus an unwanted thin film is formed while the processing gases are deposited on the wall surfaces inside the processing space. However, when a process atmosphere such as plasma is formed in the processing space, there is a problem in that the thin film acts as a contaminating substance during the substrate processing process while separated as particles by means of a magnetic field or an electric filed formed in a plasma generation space. Therefore, problems occur in that not only the quality of the thin film on the substrate, but also the efficiency of the processing process on the substrate is degraded.

In the exemplary embodiment, in order to prevent the problem of particle separation from the inner wall of the processing space and improve the efficiency of the substrate processing process, the plasma reaction part 130 is provided outside the first tube 110 so that the decomposed process gas is supplied into the processing space of the first tube 110. The plasma reaction part 130 is a component, which decomposes the process gas received from the gas supply part 160 and provides the decomposed process gas into the processing space, is disposed along the direction (the first direction) in which the plurality of substrates S are vertically loaded outside the first tube 110, and may function as an activation mechanism which activates the process gas into plasma. At this point, the plasma reaction part 130 provided outside the first tube 110 may also be disposed so as to face the exhaust part 150 each other, but the position thereof is not particularly limited.

In accordance with an exemplary embodiment, since the plasma reaction part 130 is supplied outside the first tube 110 and the process gas is thereby decomposed at the outside and supplied into the processing space, the temperature for decomposing the process gas supplied into the processing space and depositing the process gas on the substrate S, that is, the heating temperature of the heating means may be decreased. Thus, the entire temperature including that of the wall surface of the processing surface may be decreased, and thus the problem of decomposition of an unwanted thin film on the inner wall of the processing space may be mitigated. In addition, since plasma is not formed inside the processing space but formed outside the first tube 110 (that is, the outside of the processing space), the problem, in which the thin film formed on the inner wall of the processing space is detached by means of a magnetic field or an electric field generated by the formation of the plasma in the inner space of the processing space after the process gas is supplied to the process space, may be prevented.

Furthermore, the plasma reaction part 130 is not disposed inside the processing space but disposed outside the first tube 110, and thus, the first tube 110 may limit unit processing spaces in which respective substrates S are processed. Therefore, all the decomposed gases decomposed by the plasma reaction part 130 are injected through the injection ports 111 of the first tube 110 corresponding to respective unit processing spaces, and thus, an ideal laminar flow may be formed while the decomposed gas is introduced into the exhaust ports 153 located at the same line.

More specifically, when the plasma reaction part 130 in accordance with an exemplary embodiment is provided outside the first tube 110, the first tube 110 may limit the unit processing spaces which are formed in the processing space and in which the plurality of substrates S are loaded. In addition, since the unit processing spaces of the substrates S loaded on respective layers are restricted by the inner wall surface of the processing space and provided separately from each other, the decomposed gas injected from respective injection ports 111 corresponding to the unit processing spaces may be uniformly and effectively supplied on to the upper surface of the substrates without a problem of being wasted, and form a laminar flow. That is, since most of the processing space of the first tube 110 may be configured from the unit processing spaces by the plasma reaction part 130 provided outside the first tube 110, all the process gases decomposed by the plasma reaction part 130 may form a laminar flow while flowing into the respective unit processing spaces corresponding to the injection ports 111, and thus the efficiency of the substrate processing process may be improved.

Conversely, when the plasma reaction part 130 is not provided outside the first tube 110 but provided inside the processing space for the substrates S, respective unit processing spaces cannot be restricted by the inner wall of the first tube 110 due to the space partially occupied by the plasma reaction part 130 and the unit processing spaces communicate with other free spaces. Thus, there is a problem in that the decomposed gases supplied from the plasma reaction part 130 do not flow on the surfaces of the substrates S, but flow into free spaces inside the processing space, and thus, the formation of an ideal laminar flow is difficult. Accordingly, in the exemplary embodiment, the plasma reaction part 130 was provided outside the first tube 130.

The substrate processing apparatus in accordance with an exemplary embodiment further includes a second tube 120 which surrounds the outside of the first tube 110 while being spaced apart from the first tube 110 so that a separation space is formed between the first tube 110 and the second tube 120, and the plasma reaction part 130 may be provided in the separation space.

In the exemplary embodiment, the second tube 120 surrounding the outside of the first tube 110 while being spaced apart from the first tube was disposed so as to further facilitate the control of the environment of the plasma reaction part 130, and the separation space was formed which was shielded from the external environment in an atmospheric pressure state and formed between the outer wall of the first tube 110, that is, an inner tube, and the inner wall of the second tube 120, that is, an outer tube, and the plasma reaction part 130 was disposed in the separation space.

The processing space in which the substrates S are processed is in a vacuum state, and the outside of the plasma reaction part 130 is in the atmospheric pressure state. Since each of the spaces among the processing space of the first tube 110 and the outer space of the plasma reaction part 130 provided outside the first tube 110 and the plasma reaction part 130 are respectively formed in atmospheres different from each other, the control of the atmosphere suitable to form plasma, that is, the atmosphere such as the pressure and temperature of the plasma reaction part 130 may be very important. Thus, in the exemplary embodiment, in order to easily control the atmosphere suitable to generate the plasma by separating the plasma reaction part 130 from the processing space in a vacuum state and more effectively shielding the plasma reaction part 130 from the external space in the atmospheric pressure state, the second tube 120 surrounding the first tube from the outside of the first tube 110 was disposed to form the separation space (or a buffer space) between the first tube 110 and the second tube 120, and the plasma reaction part was provided in an independent space shielded from the processing space in the vacuum state and the external atmosphere in the atmospheric pressure state, that, is, in the separation space.

In addition, the heating means may be provided to surround the processing space from the outside, but when the plasma reaction part 130 is provided in the separation space which is the space between the first tube 110 and the second tube 120, it may be easier to install the heating means which surrounds the outside of the second tube 120 which is the outer tube. That is, since the plasma reaction part 130 is not formed to protrude from the outside of the second tube 120 but formed inside the separation space, the heating means may be installed without being restricted by the plasma reaction part 130. Here, as illustrated in FIGS. 1 to 3B, although the plurality of gas supply parts 160 which provide the process gas to the plasma reaction part 130 are illustrated to protrude to the outside of the second tube 120, the positions thereof are not particularly thereto, if only the position can be provided outside the line connecting the power supply electrode parts 132 and the ground electrode part 131. The detailed description about the positions of the gas supply parts 160 will be provided later.

Meanwhile, in order to activate the process gas with plasma, one RF power source is generally applied to two electrodes, but when the one RF power source is applied, a problem occurs in that particles are generated while the power for stably forming plasma is raised. That is, when the one RF power source is applied, since particles ionized by a high power for forming the plasma has high energy, a tube 170 for protecting the electrodes, damage or the like to a separation barrier rib 133, the first tube 110 and the second tube 120 is caused, and thus particles are generated. Accordingly, in the exemplary embodiment, in order to provide the process gas into the processing space after decomposing the process gas not in the processing space but in the outside, the plasma reaction part 130 was provided, and the plasma reaction part 130 was provided with the plurality of power supply electrode parts 132 and the ground electrode part 131 between the plurality of power supply electrode parts 132 to decrease the power required for generating the plasma, and thus the generation of the particles due to the high RF power was prevented.

The plasma reaction part 130 may include: the plurality of power supply electrode parts 132 extending in the first direction; and the ground electrode part 131 provided between the plurality of power supply electrode parts 132 and extending in the first direction. In addition, the plasma reaction part 130 may further include a barrier rib 133 which accommodates the plurality of power supply electrode parts 132 and the ground electrode part 131 and defines the inner space in which the plasma is formed.

The power supply electrode parts 132 may receive RF power applied from a variable power supply part 180 respectively on the electrodes extending in the first direction in which the substrates S are loaded, and the detailed description about the variable power supply part 180 for applying RF power to each of the power supply electrode parts 132 will be provided later.

The ground electrode part 131 may be electrode extending in the lading direction of the substrates S like the power supply electrode parts 132, and be installed to be spaced a distance in parallel apart from the power supply electrode parts 132 between the plurality of power supply electrode parts 132 so that a plurality of plasma generation spaces are formed between the power supply electrode parts 132 and the ground electrode part 131.

When the RF power is applied to the power supply electrode parts 132 from the variable power supply part 180, an electric field is generated between the power supply electrode parts 132 and the ground electrode part 131 and the generation of plasma occurs. As in the exemplary embodiment, when an electrode structure is provided in which the power supply electrode parts 132 are respectively installed outside the ground electrode part 131, the RF power required for generating plasma for decomposing the process gas, that is, obtaining radicals of desired amount may be reduced to one half of the required power. Therefore, the problem may be prevented, in which damage to the tube 170, the barrier rib 133, the first tube 110, the second tube 120, and the like is caused and particles are thereby generated. That is, when the RF power required to decompose the process gas with sufficient energy is, for example, approximately 100 W, and a structure is provided in which the ground electrode part 131 is installed between the plurality of power supply electrode parts 132, a power lower than approximately 100 W, for example, a power of approximately 50 W may be supplied to each of the power supply electrode parts 132 to generate plasma. Therefore, even though a power lower than the required power is supplied, the process gas may finally be more effectively decomposed with sufficient energy like in the case of supplying the power of approximately 100 W without generating particles.

At this point, the power supply electrode parts 132 and the ground electrode part 131 are not electrically connected and disposed to be spaced apart from each other, and the capacitive coupling plasma (CCP) method may be used in which plasma is generated by an electric field generated between the power supply electrode parts 132 and the ground electrode part 131 by applying the RF power to each of the power supply electrode parts 132.

Before describing the CCP method used in an exemplary embodiment, firstly, the ICP method, in which plasma is generated from an electric field around a magnetic field when the magnetic field generated from a current flowing though an antenna varies over time, is classified into an E-mode and a H-mode according to the plasma density or applied power. In general, in the ICP method, plasma is generated by means of the E-mode, and a high density plasma is generated while being converted by means of the H-mode. In order to achieve a mode conversion from the E-mode in which the plasma density is generally low to the H-mode having a high density at which the plasma is maintained, a high power should be maintained. However, in case of the high power, that is, when the input power is increased, particles and a large number of radicals which do not participate in the reaction due to high electron temperatures are generated. Therefore, there is a problem in that it is difficult to obtain a good-quality thin film and to generate uniform plasma according to an electric field formed by an antenna.

Conversely, in the exemplary embodiment, the CCP method is used in which an electron acceleration occurs by means of an electric field formed between the power supply electrode parts 132 and the ground electrode part 131 which are not connected to each other but spaced apart from each other and plasma is thereby generated. Therefore, as in the ICP method, a high power for maintain the plasma is not required, the electron temperature is thereby lowered, a large number of radicals participating in the reaction are generated, and thus, a good-quality thin film may be more effectively obtained. In addition, in the case of the CCP method in which a single electrode is used, radicals of desired amount may be obtained only by applying high power because the radicals participating in the reaction is affected according to an induced power. However, in the CCP method in which multiple electrodes (a structure in which the ground electrode part 131 is installed between the plurality of power supply electrode parts 132) are used, as illustrated above, since the power may be dividedly supplied to each electrode, the radicals of the same amount may be obtained even with a power lower than the power supplied to the single electrode.

The substrate processing apparatus in accordance with an exemplary embodiment may further include a ceramic tube 170 surrounding the outer peripheral surfaces of the plurality of power supply electrode parts 132 and the ground electrode part 131.

Each of the plurality of power supply electrode parts 132 and the ground electrode part 131 may be protected in a state of being surrounded by the ceramic tube 170 which protects each of the electrode parts from the upper portion to the lower portion thereof, and the plurality of power supply electrode parts 132 and the ground electrode part 131 may be configured from a flexible braided wire.

In general, electricity conduction according to use of RF may be affected by the skin depth of a metal which is the depth at which a current flows. When net-type mesh electrodes are used in the plasma reaction part in which an RF power is applied to generate plasma, since the area occupied by a free space is wide, there is a problem in that large resistance due to a small surface area is inefficient for the application of RF power. Furthermore, the substrate processing process is repeatedly performed at a high temperature and a low temperature. When the electrodes are formed in the mesh type, the shapes of the mesh electrodes are irregularly changed according to varying temperatures to become disadvantageous in an aspect of maintaining the shapes, and the resistance varies according to the changed shapes. Therefore, when the RF power is applied, there is a problem of occurrence of uneven plasma.

Conversely, the plurality of power supply electrode parts 132 and the ground electrode part 131 in accordance with the exemplary embodiment minimize a free space as well as being inserted into the ceramic tube 170, and may be formed in a flexible braided type (braided wire) in order to prevent the above-mentioned problems. In an embodiment, in order to further decrease the free space, a method of coating the surface of each of the electrode parts.

In addition, in order to extend, in the first direction, the flexible braided-type power supply electrode parts 132 and the ground electrode part 131 and maintain in a fixed state, the substrate processing apparatus in accordance with an exemplary embodiment may further include a spring part (not shown) which fixes and supports both ends of respective electrode parts so as not to allow the both ends to move. The flexible power supply electrode parts 132 and the ground electrode part 131 may each be fixed in the first direction and thereby be maintained in a long-thin rod shape.

The ceramic tube 170 surrounds the outer peripheral surfaces of the power supply electrode parts 132 and the ground electrode part 131, so that the ceramic tube 170 may electrically insulate each of the electrode parts and protect the electrodes exposed to a plasma atmosphere. Thus, the electrode parts may be safely protected from contamination or particles which may be generated by plasma. The ceramic tube 170 are composed of a heat-resistant material such as quartz or ceramic like the first tube 110 and the second tube 120 and may thereby be integrally manufactured with the first tube 110 and the second tube 120.

The plurality of power supply electrode parts 132 and the ground electrode part 131 which are surrounded by the ceramic tube 170 may be accommodated inside the barrier rib 133 which defines the inner space in which plasma is formed. By separately forming the barrier rib 133 which defines the inner space inside the separation space, the time for the process gas to be evenly spread inside the plasma reaction part 130 may be reduced, and the plasma decomposition speed of the process gas supplied into the barrier rib 133 may thereby be improved. Thus, the efficiency of the processing process for the substrates S may be increased.

Referring again to FIGS. 1 and 2, the plurality of gas supply parts 160 extend in the first direction and are provided outside the line connecting the power supply electrode parts 132 and the ground electrode part 131, and the supply ports 161 of the gas supply parts 160 may be provided to be directed toward respective spaces between the power supply electrode parts 132 and the ground electrode part 131.

The gas supply parts 160 may supply the process gas into the plasma reaction part 130 so that the process gas required for the process of processing the substrate S is decomposed in the plasma reaction part 130. When the inside of the plasma reaction part 130 is filled with the process gas received from the plurality of gas supply parts 160, a predetermined RF power is applied to each of the power supply electrode parts 132, and plasma may thereby be generated between the power supply electrode parts 132 and the ground electrode part 131 which face each other. The process gas excited in a plasma state and decomposed may be supplied into the processing space and the substrate processing process may thereby be performed.

When the plurality of gas supply parts 160 are provided to the outside from the line connecting the power supply electrode parts 132 and the ground electrode part 131, and when the supply ports 161 of the gas supply parts 160 are provided to direct toward respective spaces between the power supply electrode parts 132 and the ground electrode part 131, the supply ports 161 of the gas supply parts 160 may face the spaces between the power supply electrode parts 132 and the ground electrode part 131, and thus, the decomposition rate of the plasma may be increased. That is, since the process gas supplied through the supply ports 161 of the gas supply parts 160 may directly be supplied to the plasma generation space between the power supply electrode parts 132 and the ground electrode part 131, the time for the process gas for decomposition is spread into the plasma generation space may be reduced. Accordingly, the decomposition speed of the process gas may be improved and thus, the plasma decomposition rate may also be improved In addition, the plurality of gas supply parts 160 are provided outside the line connecting the power supply electrode parts 132 and the ground electrode part 131, and the supply ports 161 of the gas supply parts 160 are provided to face respective spaces between the power supply electrode parts 132 and the ground electrode part 131. Thus, the size of the space of the plasma reaction part 130 surrounded by the barrier rib 133 may be reduced. Accordingly, the time for the process gas supplied to the plasma reaction part 130 to be evenly spread may be reduced, and thus, the time for the process gas to be supplied to the processing space after undergoing the plasma decomposition may also be reduced. As illustrated in FIGS. 1 and 2, the plurality of gas supply parts 160 are illustrated to extrude from the outer surface of the second tube 120 and be respectively provided between the power supply electrode parts 132 and the ground electrode part 131. However, as long as a position may be provided between the power supply electrode parts 132 and the ground electrode part 131 and provided outside the extending line of the power supply electrode parts 132 and the ground electrode part 131, the position is not particularly limited.

The injection ports 111 and the supply ports 161 may be provided to be misaligned with each other in the radial direction from the central axis of the first tube 110 to the supply ports 161.

The above-mentioned injection ports 111 of the first tube 110 may be formed at heights different from each other in the first direction corresponding to respective unit processing spaces of the substrate support part 140 and disposed at positions corresponding to the power supply electrode parts 132 extending in the first direction, and the supply ports 161 of the gas supply part 160 may be provided to face respective spaces between the power supply electrode parts 132 and the ground electrode part 131. Therefore, the injection ports 111 and the supply ports 161 may be misaligned with each other in the radial direction from the central axis of the first tube 110 to the supply ports 161. When the positions of the injection ports 111 and the supply ports do not correspond to each other, but are misaligned with each other as illustrated in FIGS. 1 and 2, the process gas supplied through the supply ports 161 does not escape through the injection ports 111 of the first tube 110 but is decomposed after a temporal margin for plasma decomposition and escapes through the injection ports 111. Therefore, the plasma decomposition efficiency may be further improved.

Figure 4:
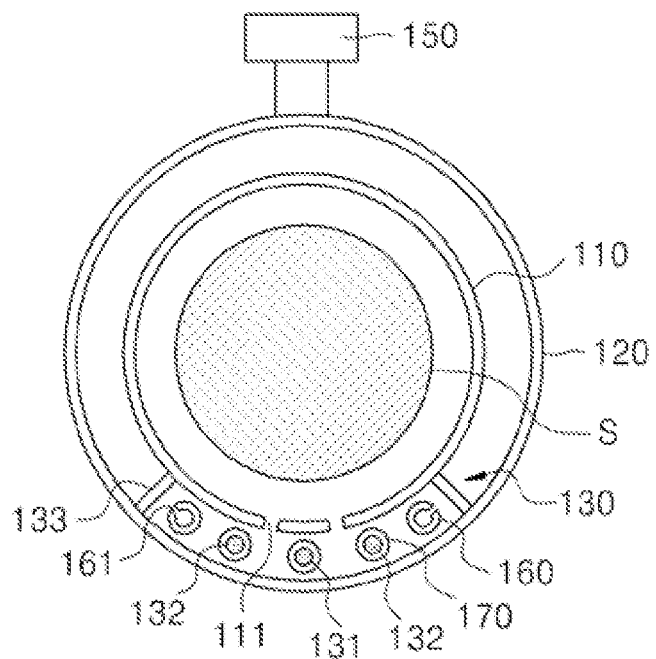
FIG. 4 is a plan view illustrating a substrate processing apparatus in accordance with still another exemplary embodiment.

FIG. 4 is a plan view illustrating a substrate processing apparatus in accordance with still another exemplary embodiment.

Referring to FIG. 4, in still another exemplary embodiment, a plurality of power supply electrode parts 132 and a ground electrode part 131 are disposed to be spaced apart from each other in the peripheral direction of a first tube 110, and the plurality of gas supply parts 160 extend in the first direction and may thereby be provided respectively outside the power supply electrode parts 132.

The gas supply parts 160, which extend in the first direction like the plurality of power supply electrode parts 132 and the ground electrode part 131, are provided in a barrier rib 133 outside the power supply electrode parts 132 disposed to be spaced apart from each other in the peripheral direction of the first tube 110 so that the process gas required for the process in which substrates S are processed may be decomposed in a plasma reaction part 130. Thus, the gas supply parts 160 may supply the process gas into the plasma reaction part 130.

When the inside of the plasma reaction part 130 is filled with the process gas supplied from the plurality of gas supply parts 160, the process gas may be plasma-decomposed by applying a predetermined RF power to respective power supply electrode parts 132, and the decomposed process gas may be supplied into the processing space, and thus, a substrate processing process may be performed.

Here, the supply ports 161 of the gas supply parts 160 may be formed to face the direction opposed to the power supply electrode parts 132.

When the supply ports 161 of the gas supply parts 160 provided outside respective power supply electrode parts 132 are provided to face a barrier rib 133, the process gas supplied from the supply parts 161 may be gradually spread to the central region of the plasma reaction part 130 from the barrier rib 133 facing the supply ports 161. Thus, the process gas may evenly be distributed in the entire space inside the plasma reaction part 130, and the entire process gas may thereby be decomposed with plasma and provided to a processing space.

Unlike the exemplary embodiment, when the supply ports 161 of the gas supply parts 160 respectively provided outside the power supply electrode parts 132 are not formed at positions facing the barrier rib 133, but formed at positions conversely facing the power supply electrode parts 132, the process gas is spread into the plasma reaction part 130 and may escape to a processing space through the injection ports 111 of the first tube 110 without a temporal margin for being decomposed with plasma. Therefore, not only the process gas may be wasted, but also the process efficiency may thereby be degraded.

Conversely, in the exemplary embodiment, since the supply ports 161 of the gas supply parts 160 are formed at positions facing the barrier rib 133, the process gas does not escape to the processing space through the injection ports 111, but is evenly spread and filled into a central region from a peripheral region (that is, the barrier rib 133 facing the supply parts 161) of the plasma reaction part 130. Thus, a temporal margin increases during which the process gas may stay inside the plasma reaction part 130, and the plasma decomposition efficiency of the process gas may be improved.

Figure 5:
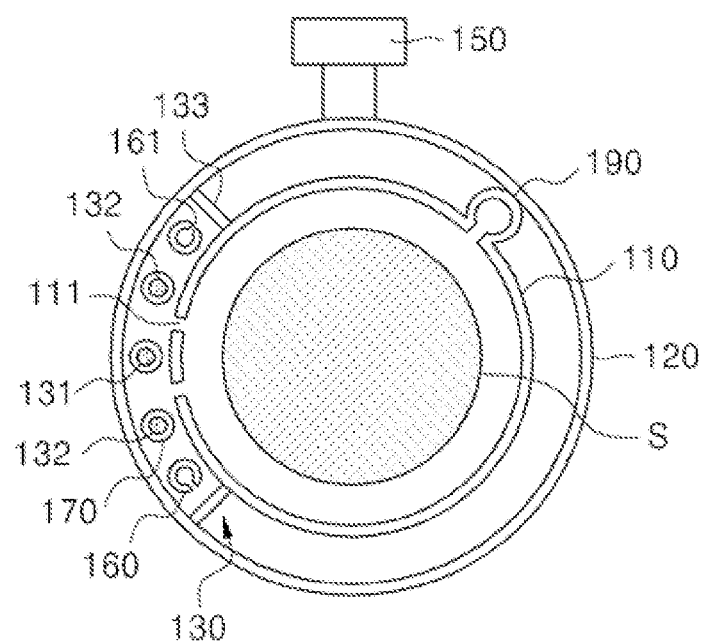
FIG. 5 is a plan view illustrating a gas supply part in accordance with an exemplary embodiment.

FIG. 5 is a plan view illustrating a gas supply part in accordance with an exemplary embodiment.

Referring to FIG. 5, a gas supply parts 160 may include: a reaction gas supply part 160 which supplies a plasma reaction part 130 with a reaction gas; and a source gas supply part 190 which supplies a processing space with a source gas, wherein the plasma reaction part 130 may decompose the reaction gas with plasma.

The process gas may include one or more types of gas, that is, the reaction gas and the source gas, and the source gas supply part 190 may supply the source gas directly to the processing space. The source gas may be composed of a gas (dichlorosilane ($SiH_2Cl_2$, abbreviation: DCS etc.) which contains a thin film material such as silicone including a thin-film material to be deposited on to substrates S.

Unlike the source gas supply part 190 which supplies the source gas directly to the processing space, the reaction gas supply part 160 may supply a reaction gas firstly into the plasma reaction part 130, and the reaction gas may be activated by plasma and provided into the processing space. Such a reaction gas may be composed of a gas (nitrogen-containing gas), such as $NH_3$, $N_2O$, and NO, including nitrogen which forms a thin-film layer by being reacted with the source gas.

In accordance with the exemplary embodiment, the reaction gas such as $NH_3$, $N_2O$, and NO, which has a gas decomposition temperature higher than the source gas which is decomposed at a low temperature, is supplied to the plasma reaction part 130, so that the reaction gas may be effectively decomposed by the plasma reaction part 130 and provided to the processing space. Since the feature in which the reaction gas is decomposed with plasma is the same as that described with reference to FIGS. 1 to 4, the detailed description thereon will not be provided here.

Figure 6A:
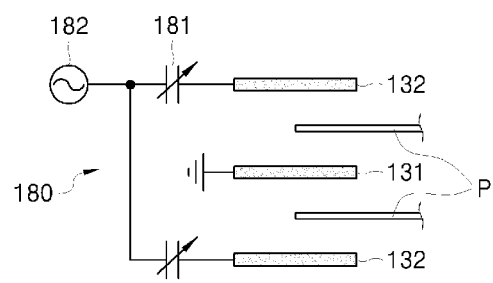
FIGS. 6A and 6B are circuit diagrams illustrating variable power supply parts in accordance with exemplary embodiments.
Figure 6B:
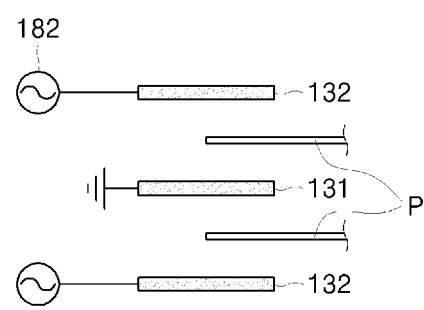

FIGS. 6A and 6B are circuit diagrams illustrating variable power supply parts in accordance with exemplary embodiments.

Referring to FIGS. 6A and 6B, a substrate processing apparatus in accordance with an exemplary embodiment may further include a variable power supply part 180 which controls the size or the ratio of an RF power applied to each of the plurality of power supply electrode parts 132.

Plasma generation spaces are spaces which are respectively formed between the plurality of power supply electrode parts and a ground electrode part 131, and the shapes, the widths, and the like of the plasma generation spaces play an important role in the plasma generation and the density determination. However, although the widths of the plasma generation spaces which are respectively formed between the plurality of power supply electrode parts 132 and the ground electrode part 131 are formed to have the same width, there is a problem in that the generation of plasma may become uneven due to various external factors. That is, although the plurality of power supply electrode parts 132 and the ground electrode part 131 are disposed to be spaced a certain distance apart from each other and a plurality of plasma generation spaces having the same width are formed, the plasma density distribution during the plasma generation are not accurately made into 1:1, and thus, a problem occurs in that the density distribution becomes uneven.

In the exemplary embodiment, the size or the ratio of the RF power applied to each of the power supply electrode parts 132 may be adjusted by using a variable power supply part 180 so that uniform plasma is generated in each of the plasma generation spaces.

The variable power supply part 180 may include a powers supply part 182 which supplies an RF power to the plurality of power supply electrode parts 132; and a plurality of variable capacitors 181 which are provided respectively between the power supply part 182 and the plurality of power supply electrode parts 132.

The power supply part 182, which supplies the RF power to each of the power supply electrode parts 132, may be electrically connected to each of the power supply electrode parts 132 and independently supply the RF power applied to the power supply electrode parts 132 as illustrated in FIG. 6B in an exemplary embodiment. In another exemplary embodiment, as illustrated in FIG. 6A, the RF power output from one power supply part 182 are distributed and may also be supplied to the plurality of variable capacitors 181 and the power supply electrode parts 132.

The variable capacitor 181 may be provided in plurality, and respectively disposed corresponding to the plurality of power supply electrode parts 132, and the plurality of variable capacitors 181 may respectively be connected between a distribution point at which the RF power supplied from the output part of the power supply part 182 and the plurality of power supply electrode parts 132. In addition, the variable capacitor 181 may adjust the size or ratio of the RF power supplied from the power source part 182 electrically connected to the variable capacitor.

The variable power supply part 180 may further include probing rods P which are respectively provided in the spaces between the plurality of power supply electrode parts 132 and the ground electrode part 131 and configured to measure discharge characteristic values of the plasma, wherein the size and ratio of the RF power may be adjusted by using the discharge characteristic values measured from the probing rods P.

The probing rods P may be provided respective spaces between the plurality of power source electrode parts 132 and the ground electrode part 131 so that the variable capacitors 181 adjust the size of ratio of the RF power, and the discharge characteristic value, that is, a discharge current, a discharge voltage, a phase, and the like of the plasma formed in the plasma generation space are measured from the probing rod P, and the size or the ratio of the RF power may be adjusted.

In accordance with the exemplary embodiment, the size or ratio of the RF power respectively applied to the power supply electrode parts 132 is controlled and the deposition of radicals required for the substrate processing process may be variably adjusted. Thus, the problem in which the plasma density distribution becomes uneven may be solved.

In an exemplary embodiment, a plasma reaction part is provided outside a first tube, and thus, a process gas supplied from a gas supply part may be decomposed in the plasma reaction part and then be supplied into a processing space. That is, since the process gas is not decomposed with plasma after being supplied into the processing space, but the process gas decomposed with plasma in the outside is supplied into the processing space, not only the problem in which particles are separated from an inner wall of the processing space may be prevented, but also the efficiency of a substrate processing process may be improved.

In addition, a power source required to stably generate plasma is reduced by being provided with a plurality of power supply electrode parts and a ground electrode part, and thus the generation of particles due to a high RF power source may be prevented.

Furthermore, the size or ratio of the RF power applied to each of the power supply electrode parts is adjusted by using a variable power supply part, and thus plasma may be uniformly generated in each of the plasma generation spaces.

So far, in the detailed description of the present disclosure, specific exemplary embodiments have been described, but various modifications can be made thereto without departing from the spirit and scope of the present disclosure. Therefore, the scope of the invention is defined not by the detailed description of the invention but by the appended claims, and all differences within the scope will be construed as being included in the present invention.

What is claimed is:

1. A substrate processing apparatus comprising: a first tube configured to provide a processing space in which a plurality of substrates are processed;
    a substrate support part configured to load the plurality of substrates in a first direction in the processing space;
    a plurality of gas supply parts provided with supply ports for supplying a process gas required for a process in which the substrates are processed;
    an exhaust part configured to communicate with the first tube and discharge process residues inside the processing space to the outside; and
    a plasma reaction part provided outside the first tube, and configured to decompose, with a plasma, the process gas supplied from the gas supply part and provide a decomposed process gas into the processing space, wherein the plasma reaction part comprises:
    a plurality of power supply electrode parts extending in the first direction; and a ground electrode part provided between the plurality of power supply electrode parts and extending in the first direction,
    wherein the first tube comprises a plurality of injection ports to inject the decomposed process gas from the plasma reaction part into the processing space, the plurality of injection ports being disposed along the first direction, symmetrically at both sides of the ground electrode part in a circumferential direction of a central axis of the first tube, and
    wherein the plurality of gas supply parts are at least partially disposed such that the respective supply ports are provided symmetrically at both sides of the ground electrode part in a circumferential direction from the central axis of the first tube.

2. The substrate processing apparatus of claim 1, further comprising a second tube configured to be spaced apart from the first tube and surround the outside of the first tube such that a separation space is formed between the second tube and the first tube, wherein
    the plasma reaction part is provided in the separation space.

3. The substrate processing apparatus of claim 1, wherein the plasma reaction part accommodates the plurality of power supply electrode parts and the ground electrode part and further comprises a barrier rib configured to define an inner space in which the plasma is formed.

4. The substrate processing apparatus of claim 1, further comprising a variable power supply part configured to control a size or ratio of a RF power applied to each of the plurality of power supply electrode parts to thereby supply the RF power.

5. The substrate processing apparatus of claim 4, wherein the variable power supply part comprises:
    a power supply part configured to supply the RF power to the plurality of power supply electrode parts; and
    a plurality of variable capacitors respectively provided between the power supply part and the plurality of power supply electrode parts.

6. The substrate processing apparatus of claim 4, wherein the variable power supply parts further comprise probing rods which are respectively provided in the spaces between the plurality of power supply electrode parts and the ground electrode part and configured to measure discharge characteristic values of the plasma, wherein
    the size and ratio of the RF power is adjusted according to the discharge characteristic values measured from the probing rods.

7. The substrate processing apparatus of claim 1, further comprising a ceramic tube configured to surround outer peripheral surfaces of the plurality of power supply electrode parts and the ground electrode part.

8. The substrate processing apparatus of claim 1, wherein
    the plurality of power supply electrode parts and the ground electrode part are disposed to be spaced apart from each other in a peripheral direction of the first tube, and
    the plurality of gas supply parts extend in the first direction and are respectively provided outside the power supply electrode parts.

9. The substrate processing apparatus of claim 1, wherein supply ports of the gas supply parts are formed to face a direction opposed to the power supply electrode parts.

10. The substrate processing apparatus of claim 1, wherein
    the plurality of gas supply parts extend in the first direction and are provided outside a line connecting the power supply electrode parts and the ground electrode part, and
    each of the supply ports of the gas supply parts is provided to face the space between the power supply electrode parts and the ground electrode part.

11. The substrate processing apparatus of claim 1, wherein
    the first tube comprises a plurality of injection ports disposed in the first direction corresponding to the power supply electrode parts, and
    the injection ports and the supply ports are provided to be misaligned with each other with respect to a radial direction from a central axis of the first tube to the supply ports.

12. The substrate processing apparatus of claim 1, wherein the gas supply parts comprise:
    a reaction gas supply part configured to supply a reaction gas to the plasma reaction part; and
    a source gas supply part configured to supply a source gas to the processing space, wherein
    the plasma reaction part decomposes the reaction gas with the plasma.

* * * * *